(12) United States Patent  (10) Patent No.: US 8,835,237 B2
Jagannathan et al.  (45) Date of Patent: Sep. 16, 2014

(54) ROBUST REPLACEMENT GATE INTEGRATION

(71) Applicant: International Business Machines Corporation, Armonk, NY (US)

(72) Inventors: Hemanth Jagannathan, Guilderland, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/670,748

(22) Filed: Nov. 7, 2012

(65) Prior Publication Data

US 2014/0124873 A1  May 8, 2014

(51) Int. Cl.
*H01L 21/338* (2006.01)

(52) U.S. Cl.
USPC ..... 438/183; 438/184; 438/197; 257/E21.444

(58) Field of Classification Search
CPC ................................................ H01L 29/66545
USPC .................. 438/183, 184, 197; 257/E21.444
See application file for complete search history.

(56) References Cited

U.S. PATENT DOCUMENTS

| | | | |
|---|---|---|---|
| 6,642,590 B1 | 11/2003 | Besser et al. | |
| 7,091,118 B1 | 8/2006 | Pan et al. | |
| 8,084,346 B1 | 12/2011 | Guo et al. | |
| 8,148,786 B2 | 4/2012 | Kavalieros et al. | |
| 2006/0148182 A1 | 7/2006 | Datta et al. | |
| 2007/0281405 A1* | 12/2007 | Luo et al. | 438/183 |
| 2010/0237435 A1* | 9/2010 | Chudzik et al. | 257/380 |
| 2010/0270627 A1* | 10/2010 | Chang et al. | 257/411 |
| 2012/0043593 A1 | 2/2012 | Zhong et al. | |
| 2012/0043624 A1 | 2/2012 | Liang et al. | |
| 2012/0052666 A1* | 3/2012 | Choi | 438/585 |
| 2012/0061772 A1 | 3/2012 | Guo et al. | |
| 2012/0068237 A1 | 3/2012 | Booth, Jr. et al. | |
| 2012/0135590 A1 | 5/2012 | Hendrix et al. | |
| 2012/0139062 A1 | 6/2012 | Yuan et al. | |
| 2012/0202327 A1* | 8/2012 | Lehnert et al. | 438/270 |
| 2012/0299113 A1* | 11/2012 | Endo et al. | 257/369 |
| 2013/0093002 A1* | 4/2013 | Zhu et al. | 257/329 |

FOREIGN PATENT DOCUMENTS

| | | |
|---|---|---|
| CN | 102376551 A | 3/2012 |
| CN | 102386080 A | 3/2012 |

\* cited by examiner

*Primary Examiner* — Julia Slutsker
(74) *Attorney, Agent, or Firm* — L. Jeffrey Kelly; Catherine Ivers (57) ABSTRACT

A method including forming a dummy gate on a substrate, wherein the dummy gate includes an oxide, forming a pair of dielectric spacers on opposite sides of the dummy gate, and forming an inter-gate region above the substrate and in contact with at least one of the pair of dielectric spacers, the inter-gate region comprising a protective layer on top of a first oxide layer, wherein the protective layer comprises a material resistant to etching techniques designed to remove oxide. The method may further include removing the dummy gate to leave an opening, and forming a gate within the opening.

11 Claims, 11 Drawing Sheets

FIG. 22

ROBUST REPLACEMENT GATE INTEGRATION

BACKGROUND

1. Field of the Invention

The present invention generally relates to integrated circuits, and more particularly to fabricating semiconductor devices using a more robust replacement gate process flow and the resulting structure.

2. Background of Invention

Fabrication of finFET devices using a replacement gate (RG) or gate last technique may include the use of a polysilicon dummy gate material. During processing, the polysilicon dummy gate material may be removed and replaced with a metal gate. It may be difficult to remove the polysilicon dummy gate material selective to the surrounding structures. Typical removal techniques may be unable to remove all the polysilicon dummy gate material. Residual polysilicon dummy gate material remaining after the removal technique may contribute to device defects.

Therefore, a need exists for an integration method capable of completely removing the dummy gate material and reducing the risk of introducing device defects.

SUMMARY

One solution to the problem described above may include using an alternate dummy gate material, which may be more easily removed selective to the surrounding structures; in such a scheme, however, an additional protective layer to prevent the removal of some of the surrounding structures may also be required.

According to one embodiment of the present invention, a method is provided. The method may include forming a dummy gate on a substrate, wherein the dummy gate includes an oxide, forming a pair of dielectric spacers on opposite sides of the dummy gate, and forming an inter-gate region above the substrate and in contact with at least one of the pair of dielectric spacers, the inter-gate region including a protective layer on top of a first oxide layer, wherein the protective layer includes a material resistant to etching techniques designed to remove oxide. The method may further include removing the dummy gate to leave an opening, and forming a gate within the opening.

According to another exemplary embodiment, a method is provided. The method may include forming a dummy gate on a substrate, wherein the dummy gate includes an oxide, forming a pair of dielectric spacers on opposite sides of the dummy gate, and forming an inter-gate region above the substrate and in contact with at least one of the pair of dielectric spacers, the inter-gate region including a gap fill layer on top of a dielectric liner, wherein the dielectric liner is in contact with the at least one of the pair of dielectric spacers and the substrate, and wherein the gap fill layer does not contact either the at least one of the pair of dielectric spacers or the substrate. The method may further include removing the dummy gate to leave an opening, and forming a gate within the opening.

According to another exemplary embodiment, a structure is provided. The structure may include a substrate, a gate located above the substrate including a pair of dielectric spacers on opposite sides of the gate, and an inter-gate region located above the substrate and in contact with at least one of the pair of dielectric spacers, the inter-gate region including a protective layer on top of a first oxide layer, wherein the protective layer including a material resistant to etching techniques designed to remove oxide.

According to another exemplary embodiment, a structure is provided. The structure may include a substrate, a gate located above the substrate including a pair of dielectric spacers on opposite sides of the gate, and an inter-gate region located above the substrate and in contact with at least one of the pair of dielectric spacers, the inter-gate region including a replacement layer on top of a dielectric liner, wherein the dielectric liner is in contact with the at least one of the pair of dielectric spacers and the substrate, and wherein the replacement layer does not contact either the at least one of the pair of dielectric spacers or the substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 3-10 depict the section A-A, and illustrate the steps of a method of forming a finFET structure according to an exemplary embodiment.

FIGS. 11-16 depict the section A-A, and illustrate the steps of a method of forming a finFET structure according to an exemplary embodiment.

FIGS. 17-22 depict the section A-A, and illustrate the steps of a method of forming a finFET structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

A finFET device may include a plurality of fins, a gate covering a portion of the fins, where the portion of the fins covered by the gate serves as a channel region of the device and portions of the fins extending out from under the gate may serve as source and drain regions of the device; and a pair of dielectric spacers on opposite sides of the gate. It should be noted that finFET devices may be fabricated using either a replacement gate or gate last process flow, or a gate first process flow. A replacement gate process flow will be relied on for the description provided below.

Figure 1:
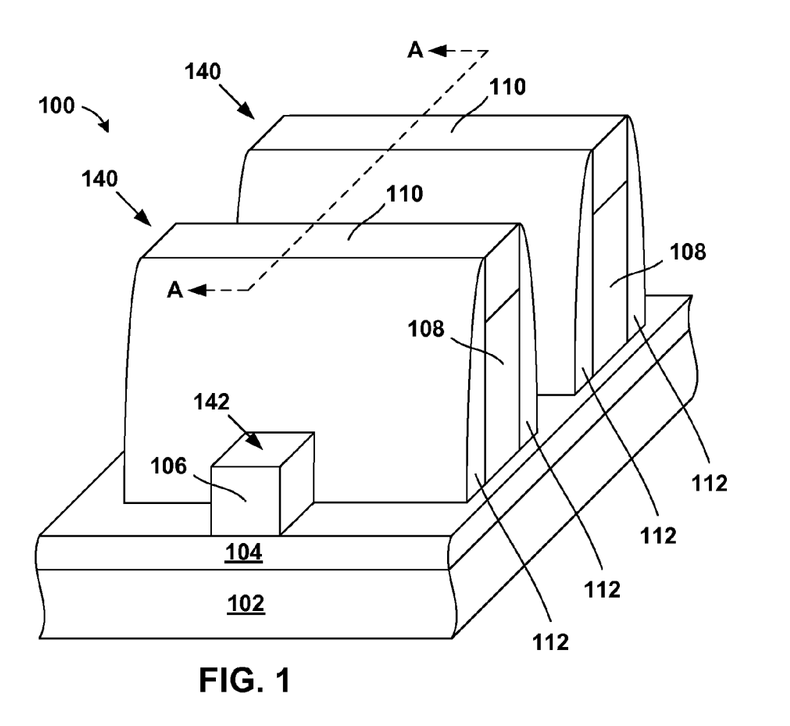
FIG. 1 depicts an isometric view of a finFET semiconductor device according to one embodiment.

Referring now to FIG. 1, an isometric view of a structure 100 is shown at an intermediate step during replacement gate process flow. At this step of fabrication the structure 100 may be generally complete with a dummy gate structure 140 formed over a fin 142 etched from a semiconductor-on-insulator (SOI) substrate. It should be noted that the dummy gate structure 140 and the fin 142 may be formed in any suitable semiconductor substrate know to a person having ordinary skill in the art, including but not limited to SOI substrates and bulk silicon substrates. Also, it should be noted that while this description refers to some components of the structure 100 in the singular tense, more than one component may be depicted throughout the figures and like components are labeled with like numerals.

The SOI substrate employed in the present embodiment may include a base substrate 102, a buried dielectric layer 104 (e.g., buried oxide) formed on top of the base substrate 102, and a SOI layer 106 formed on top of the buried dielectric layer 104. The buried dielectric layer 104 isolates the SOI layer 106 from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from 0.5 mm to about 1.5 mm.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. Alternatively, the buried dielectric layer 104 may include a thickness ranging from about 10 nm to about 500 nm. In one embodiment, the buried dielectric layer 104 may be about 150 nm thick.

The SOI layer 106 may include any of the several semiconductor materials included in the base substrate 102. In general, the base substrate 102 and the SOI layer 106 may include either identical or different semiconducting materials with respect to chemical composition, dopant concentration and crystallographic orientation. In one particular embodiment of the present invention, the base substrate 102 and the SOI layer 106 include semiconducting materials that include at least different crystallographic orientations. Typically the base substrate 102 or the SOI layer 106 include a {110} crystallographic orientation and the other of the base substrate 102 or the SOI layer 106 includes a {100} crystallographic orientation. The SOI layer 106 may include a thickness ranging from about 5 nm to about 100 nm. Methods for forming the SOI layer 106 are well known in the art. Non-limiting examples include SIMOX (Separation by Implantation of Oxygen), wafer bonding, and ELTRAN® (Epitaxial Layer TRANsfer).

The fin 142 may be etched from the SOI substrate using typical photolithography techniques. The fin 142 may be primarily formed from the SOI layer 106 of the SOI substrate. In one embodiment the fin 142 may include multiple layers in addition to the SOI layer 106 of the SOI substrate. For example, an oxide layer (not shown) and a nitride layer (not shown) may be formed on a top surface of the SOI layer 106, where the nitride layer may be located directly on top of the oxide layer.

The dummy gate structure 140 may include a dummy gate 108, a hardmask 110, and a pair of dielectric spacers 112. The dummy gate 108 followed by the hardmask 110 may be formed above the SOI layer 106. The dummy gate 108 may be deposited using typical deposition techniques, for example, atomic layer deposition (ALD), molecular layer deposition (MLD), chemical vapor deposition (CVD), physical vapor deposition (PVD), and spin on techniques. The dummy gate 108 may include any suitable dielectric, for example an oxide. In one embodiment, the dummy gate 108 may include silicon oxide, aluminum oxide, silicon carbide, amorphous carbon, or any combination thereof. The dummy gate 108 may have a thickness ranging from about 30 nm to about 100 nm and ranges there between, although a thickness less than 30 nm and greater than 100 nm may be acceptable. In a preferred embodiment, the dummy gate 108 may be only oxide; however, the dummy gate 108 may alternatively include a stack of materials. In such embodiments, materials other than oxide may be included in the stack; however, the bottom layer of the stack should be an oxide to address the residual problems of the prior art. The bottom oxide layer may have a thickness ranging from about 20% to about 60% of the total thickness of the multilayered dummy gate stack.

The hardmask 110 may also be deposited using typical deposition techniques, for example, atomic layer deposition (ALD), molecular layer deposition (MLD), chemical vapor deposition (CVD), physical vapor deposition (PVD), and spin on techniques. The hardmask 110 may include any suitable photolithographic masking material known in the art, for example, a nitride. The hardmask 110 may have a thickness ranging from about 5 nm to about 30 nm and ranges there between, although a thickness less than 5 nm and greater than 30 nm may be acceptable.

The dummy gate 108 and the hardmask 110 may collectively be referred to as a dummy gate stack. The dummy gate stack may have a pair of dielectric spacers 112 located on opposite sidewalls of the dummy gate stack. The pair of dielectric spacers 112 may be made from an insulator such as an oxide, nitride, oxynitride, or any combination thereof. In one embodiment, the pair of dielectric spacers 112 may be made form a nitride and may be formed by any suitable deposition and etching techniques known in the art. In one embodiment, the pair of dielectric spacers 112 may include multiple layers.

Figure 2:
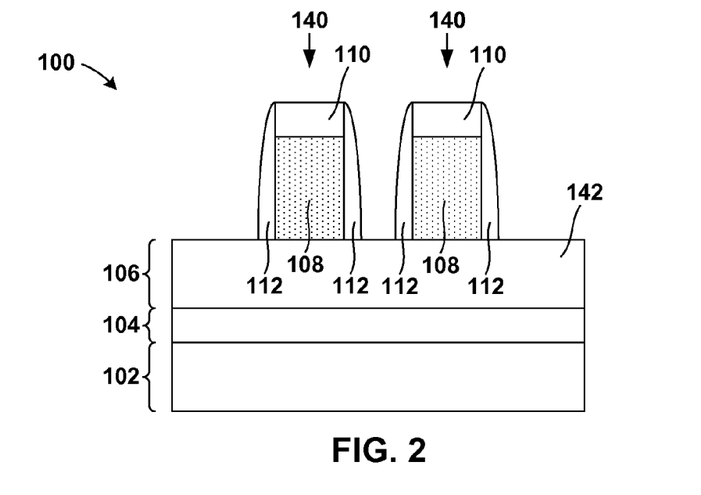
FIG. 2 depicts a cross section view, section A-A, of FIG. 1 according to one embodiment.

Referring now to FIG. 2, a cross section view, cross section A-A, of FIG. 1 is shown. It should be noted that FIGS. 3-22 all represent the cross section view, section A-A, depicted in FIG. 2. The process steps described in detail below apply to the fabrication of a finFET device; however, they may also apply equally to the fabrication of a planar device. Furthermore, additional elements depicted throughout FIGS. 3-22 that are not shown in FIGS. 1 and 2 have been included for illustrative purposes only.

One method of forming a finFET using a robust RG process flow is described in detail below by referring to the accompanying drawings in FIGS. 3-10. The robust RG process flow eliminates the use of polysilicon as the dummy gate material and uses a material that can be easily removed without the risk of damaging surrounding structures. More specifically, an oxide dummy gate material may be used in place of the traditional polysilicon dummy gate material. Doing so may require an additional protective layer to prevent the removal of oxide based materials from between the finFET devices while the oxide dummy gate material is removed from between the pair of dielectric spacers. The protective layer may include a material which is resistant to etching techniques designed to remove oxide, for example, a nitride. In this particular embodiment, the protective layer may include SiCBN.

Figure 3:
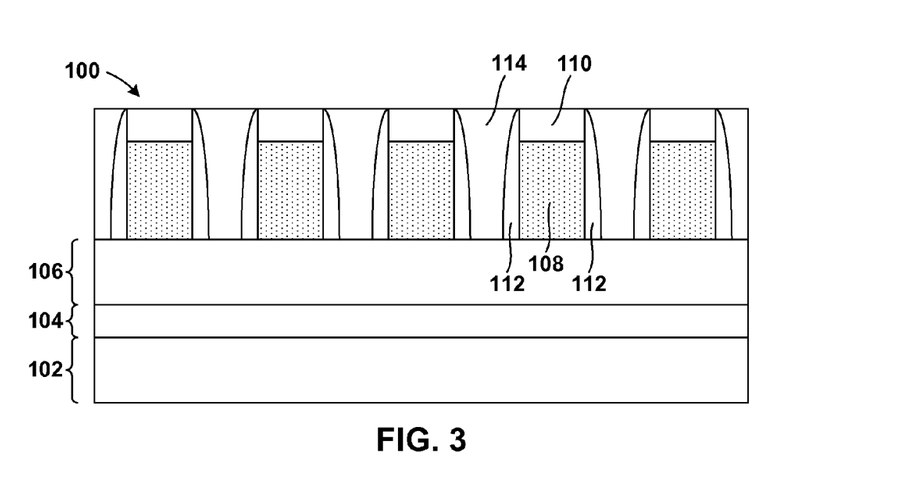
FIG. 3 depicts the deposition of a first oxide layer followed by a chemical mechanical polish (CMP) technique according to an exemplary embodiment.

Referring now to FIG. 3, a first oxide layer 114 may be deposited on top of the structure 100 and then polished to expose the top of the hardmask 110. The first oxide layer 114 may be deposited using typical deposition techniques, for example, atomic layer deposition (ALD), molecular layer deposition (MLD), chemical vapor deposition (CVD), physical vapor deposition (PVD), and spin on techniques. The first oxide layer 114 may include, for example, any suitable oxide. In one embodiment, the first oxide layer 114 may include silicon oxide, doped silicon oxide (for example carbon doped silicon oxide), or any combination thereof. The first oxide layer 114 may include the same oxide or a different oxide than the dummy gate 108. Preferably, the first oxide layer 114 may be deposited such that it may cover the hardmask 110, and then the first oxide layer 114 may be polished to be flush with the hardmask 110. In one embodiment, the first oxide layer 114 may have a thickness ranging from about 30 nm to about 100 nm and ranges there between, although a thickness less than 30 nm and greater than 100 nm may be acceptable. A person having ordinary skill in the art may refer to the first oxide layer 114 as a middle-of-line dielectric.

After depositing the first oxide layer 114, a chemical mechanical polishing (CMP) technique may be used to polish the first oxide layer 114 selective to the hardmask 110. After the CMP technique a top surface of the first oxide layer 114 may be substantially flush with a top surface of the hardmask 110.

Figure 4:
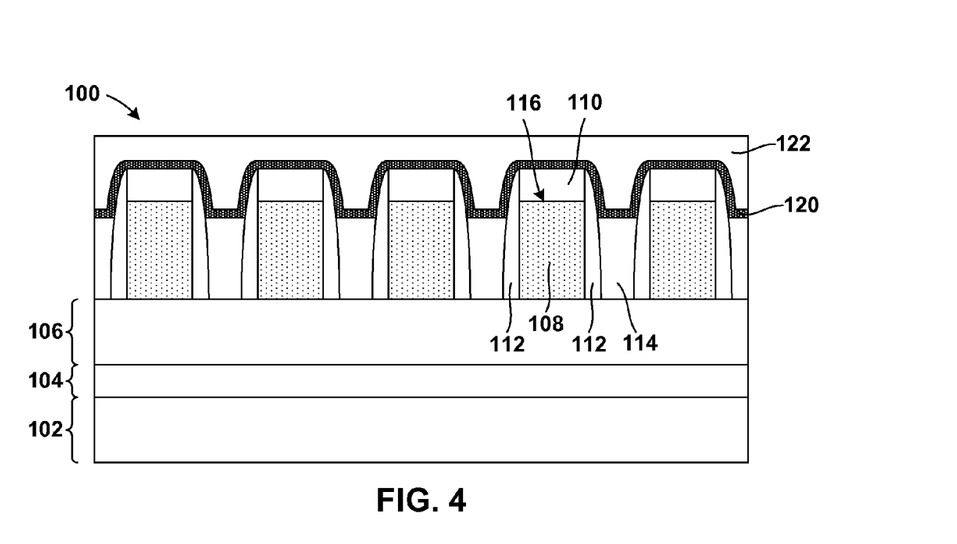
FIG. 4 depicts recessing of the first oxide layer, deposition of a protective dielectric cap, and subsequent deposition of a second oxide layer according to an exemplary embodiment.

Referring now to FIG. 4, the first oxide layer 114 may then be recessed using any suitable etching technique. In one embodiment, the first oxide layer 114 may be recessed with a known dry etching technique where oxide may be removed without the used of a wet clean step. In such dry etching techniques oxide may be reacted to form an intermediate compound that may then removed from the surface. In one embodiment, known dry etching techniques such as SiCoNi or Chemical Oxide Removal (COR) may be used to recess the first oxide layer 114. In such etching techniques, for example, gases of HF and NH3 may react with the oxide to form the intermediate compound that can later be removed without the use of any wet chemistry. The first oxide layer 114 may be recessed below a top surface 116 of the dummy gate 108 by a distance equal to or greater than the thickness of a protective layer 120. The first oxide layer 114 may be recessed below the top surface 116 of the dummy gate 108 by a distance ranging from about 2 nm to about 10 nm. Preferably, the first oxide layer 114 may be recessed at least 5 nm below the top surface 116 of the dummy gate 108.

After recessing the first oxide layer 114, the protective layer 120 may be deposited on the structure 100. The protective layer 120 may include, but is not limited to, any suitable material resistant to etching techniques designed to remove oxide, for example, hydrofluoric acid. The protective layer 120 may be deposited using any suitable deposition technique known in the art, such as, for example, atomic layer deposition (ALD), molecular layer deposition (MLD), chemical vapor deposition (CVD), deposition, physical vapor deposition (PVD), and spin on techniques. In one embodiment, the protective layer 120 may include SiBCN deposited conformally using an ALD deposition technique. The protective layer 120 may have a thickness ranging from about 3 nm to about 5 nm and ranges there between, although a thickness less than 3 nm and greater than 5 nm may be acceptable.

A second oxide layer 122 may then be deposited on top of the protective layer 120. The second oxide layer 122 may have a minimum thickness sufficient to cover all portions of the protective layer 120. The second oxide layer 122 may be deposited using typical deposition techniques, for example, atomic layer deposition (ALD), molecular layer deposition (MLD), chemical vapor deposition (CVD), physical vapor deposition (PVD), and spin on techniques. The second oxide layer 122 may include, for example, any suitable oxide. In one embodiment, the second oxide layer 122 may include silicon oxide, doped silicon oxide (for example carbon doped silicon oxide), or any combination thereof. Preferably, the second oxide layer 122 may be deposited such that it may cover the hardmask 110, and then the second oxide layer 122 may be polished to be flush with the hardmask 110. A person having ordinary skill in the art may refer to the second oxide layer 122 as a middle-of-line dielectric.

Figure 5:
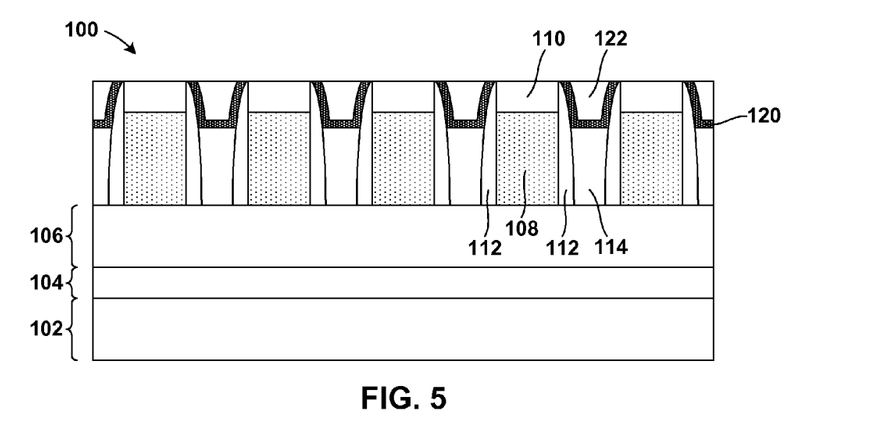
FIG. 5 depicts a CMP technique used to recess the second oxide layer according to an exemplary embodiment.

Referring now to FIG. 5, a CMP technique may be used to polish the second oxide layer 122 selective to the hardmask 110. Any suitable CMP technique capable of polishing the second oxide layer 122 selective to the hardmask 110 may be used to polish the second oxide layer 122. In one embodiment, any suitable CMP technique capable of polishing oxide selective to nitride may be used. Separated by the protective layer 120, portions of the second oxide layer 122 may remain above the first oxide layer 114 between the pair of dielectric spacers 112. The hardmask 110 may be exposed and neither the protective layer 120 nor the second oxide layer 122 may remain on top of the hardmask 110. The CMP technique may result in a top surface of the hardmask 110 being substantially flush with a top surface of the second oxide layer 122. The protective layer 120 may be further recessed during polishing of the second oxide layer 122; however the protective layer 120 may remain between, and separate, the second oxide layer 122 from the first oxide layer 114.

Figure 6:
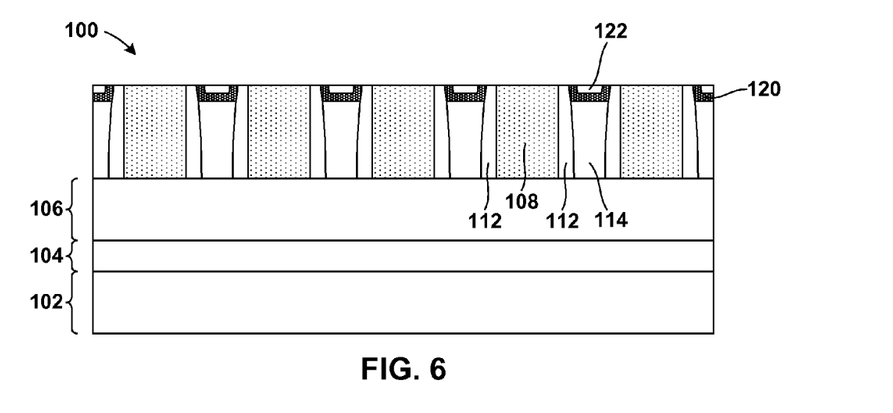
FIG. 6 depicts the removal of the hardmask according to an exemplary embodiment.

Referring now to FIG. 6, a CMP technique may be used to remove the hardmask 110. Any suitable CMP technique capable of removing the hardmask 110 selective to the dummy gate 108 may be used to remove the hardmask 110. In one embodiment, any suitable CMP technique capable of polishing nitride selective to oxide may be used to remove the hardmask 110. The protective layer 120 may be further recessed during the removal of the hardmask 110; however the protective layer 120 may remain between, and separate, the second oxide layer 122 from the first oxide layer 114.

In one embodiment, a non-selective CMP technique may be used to remove the hardmask 110. Removal of the hardmask 110 may expose the dummy gate 108 while some portions of the protective layer 120 may, preferably, remain above the first oxide layer 114 between the pair of dielectric spacers 112. In one embodiment, the CMP technique used to remove the hardmask 110 may completely remove the second oxide layer 122 from above the protective layer 120. Alternatively, any remaining material of the second oxide layer 122 may be removed in a subsequent etching step.

Figure 7:
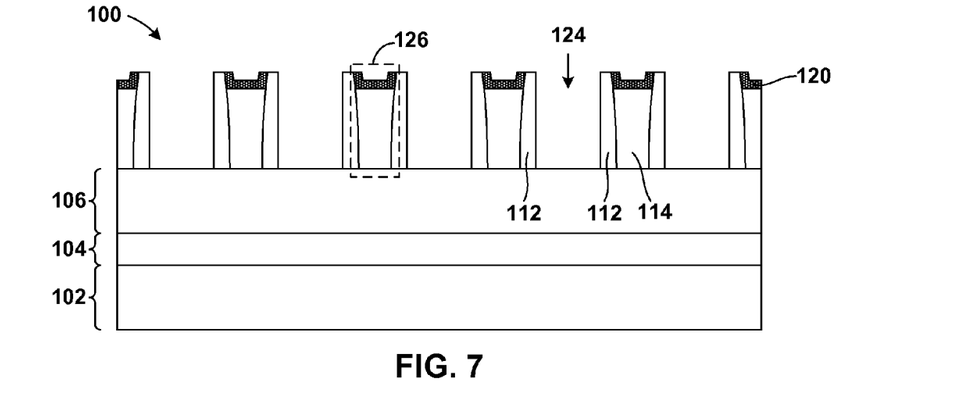
FIG. 7 depicts the removal of the dummy gate oxide according to an exemplary embodiment.

Referring now to FIG. 7, an etching technique may be used to remove the dummy gate 108 (shown in FIG. 6), and the second oxide layer 122 (shown in FIG. 6) if any remains after the previous CMP technique. Any suitable etching technique capable of removing the dummy gate 108 and optionally the second oxide layer 122 selective to the pair of dielectric spacers 112 and the protective layer 120 may be used. In one embodiment, a dry or wet etching technique suitable for removing oxide may be used to remove the dummy gate 108. In one embodiment, a wet etching technique using hydrofluoric acid chemistries may be used to remove the dummy gate 108 and optionally the second oxide layer 122. The protective layer 120 may be resistant to the etching technique and therefore protect the first oxide layer 114 during etching. Removal of the dummy gate 108 may produce an opening 124 in which a gate may be subsequently formed. The first oxide layer 114 and the protective layer 120 together may be referred to as an inter-gate region 126

Figure 8:
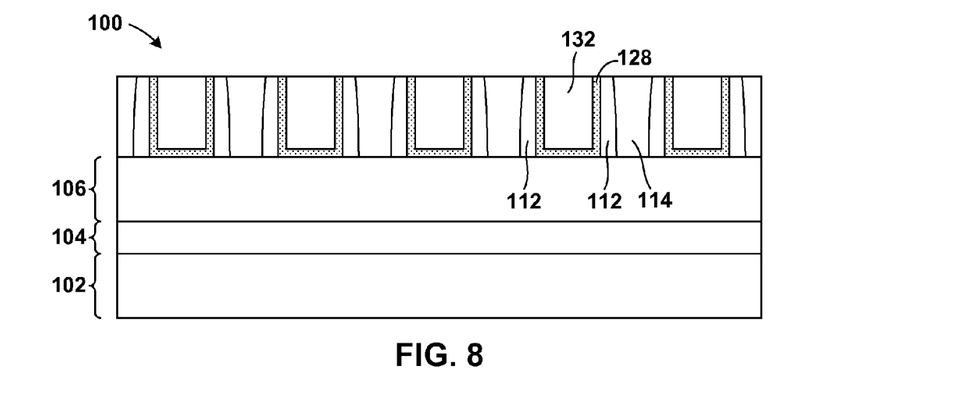
FIG. 8 depicts the deposition of a gate dielectric and a metal gate followed by a CMP technique according to an exemplary embodiment.

Now referring to FIG. 8, a gate may be formed in the opening 124 (shown in FIG. 7). The gate may include a gate dielectric 128 and a metal gate 132. The gate dielectric 128 may be conformally deposited on the surface of the structure 100 including within the opening 124. The gate dielectric 128 may be deposited by any technique known in the art, for example, atomic layer deposition (ALD), molecular layer deposition (MLD), chemical vapor deposition (CVD), deposition, physical vapor deposition (PVD).

The gate dielectric 128 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum. In a preferred embodiment, the gate dielectric 128 includes a high-k material. The gate dielectric 128 may be deposited with a thickness ranging from about 0.5 nm to about 6 nm, and more typically from about 1.2 nm to about 3 nm. The gate dielectric 128 may have an effective oxide thickness on the order of or less than 1 nm.

The metal gate 132 may be formed on top of the gate dielectric 128. The metal gate 132 may be deposited by any technique known in the art, for example, atomic layer deposition (ALD), molecular layer deposition (MLD), chemical vapor deposition (CVD), deposition, physical vapor deposition (PVD). The metal gate 132 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination of those materials. Furthermore, in one embodiment, the metal gate 132 may include multiple layers of varying materials, for example, a work function metal and a gate metal. It should be noted that techniques known in the art may be used to vary the work function metals based on the desired type and polarity of the device. In one embodiment, a work function metal (not shown) may be included between the gate dielectric 128 and the metal gate 132.

With continued reference to FIG. 8, a CMP technique may be used to remove the excess gate dielectric material and excess metal gate material from the top of the structure 100 while leaving them on the sidewalls and bottoms of the opening 124. The CMP technique may or may not remove any remaining portions of the protective layer 120. The protective layer 120 may function as a CMP stop layer during gate formation. In some instances, the protective layer 120 may be removed during the removal of the excess gate dielectric material and excess metal gate material. In one embodiment, when not removed during the CMP technique, the protective layer 120 may be removed in a subsequent contact etch process, as described below. In other instances, the protective layer 120 may remain in place after polish and contact etch, as later described with reference to FIG. 10.

Figure 9:
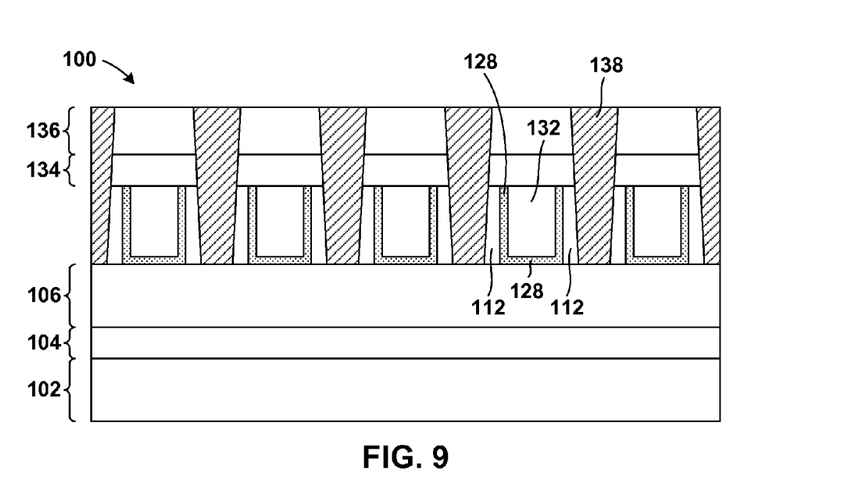
FIG. 9 depicts the formation of additional oxide layers and the subsequent formation of a contact according to an exemplary embodiment.

Referring now to FIG. 9, techniques known to a person having ordinary skill in the art may be used to complete fabrication of the structure 100. Completion of the structure 100 may include deposition of a dielectric capping layer 134, deposition of an inter-level dielectric layer 136, followed by the formation of a contact 138.

The dielectric capping layer 134 may be deposited by any technique known in the art, for example, atomic layer deposition (ALD), molecular layer deposition (MLD), chemical vapor deposition (CVD), deposition, physical vapor deposition (PVD). The dielectric capping layer 134 may be an oxide, nitride, oxynitride or any combination thereof. The dielectric capping layer 134 can be made of a different dielectric material than the pair of dielectric spacers 112. In one embodiment, a nitride such as, for example, $Si_3N_4$, may be used as the dielectric capping layer 134. In one embodiment, the dielectric capping layer 134 may be an oxide such as $SiO_2$. Preferably, the dielectric capping layer 134 may have a vertical thickness ranging from about 20 nm to about 180 nm. More preferably the dielectric capping layer 134 may have a thickness ranging from about 30 nm to about 140 nm.

The inter-level dielectric layer 136 may then be deposited on top of the dielectric capping layer 134. The inter-level dielectric layer 136 may be deposited by any technique known in the art, for example by atomic layer deposition (ALD), molecular layer deposition (MLD), chemical vapor deposition (CVD), physical vapor deposition (PVD), and spin on techniques. The inter-level dielectric layer 136 may include, for example, any suitable oxide. In one embodiment, the inter-level dielectric layer 136 may include silicon oxide, doped silicon oxide (for example carbon doped silicon oxide), or any combination thereof. The inter-level dielectric layer 136 may have a thickness ranging from about 30 nm to about 100 nm and ranges there between, although a thickness less than 30 nm and greater than 100 nm may be acceptable. A person having ordinary skill in the art may refer to the inter-level dielectric layer 136 as a middle-of-line dielectric. It should be noted that the inter-level dielectric layer 136 may be made from the same material or a different material than the second oxide layer 122.

Finally, a contact hole may be etched through the inter-level dielectric layer 136, the dielectric capping layer 134, and the first oxide layer 114 using typical photolithographic techniques. For example, The contact hole may be formed using any suitable etching technique such as dry etch, wet etch, or combination of both, however, the etching technique may be selective to the pair of dielectric spacers 112 and the fin 105. In one embodiment, reactive ion etching may be used to form the contact hole. The contact 138 may then be formed by filling the contact hole with a conductive material. In one embodiment, the contact 138 may be formed by depositing, for example, tungsten, copper, aluminum, and alloys thereof, and any suitable combination thereof.

Figure 10:
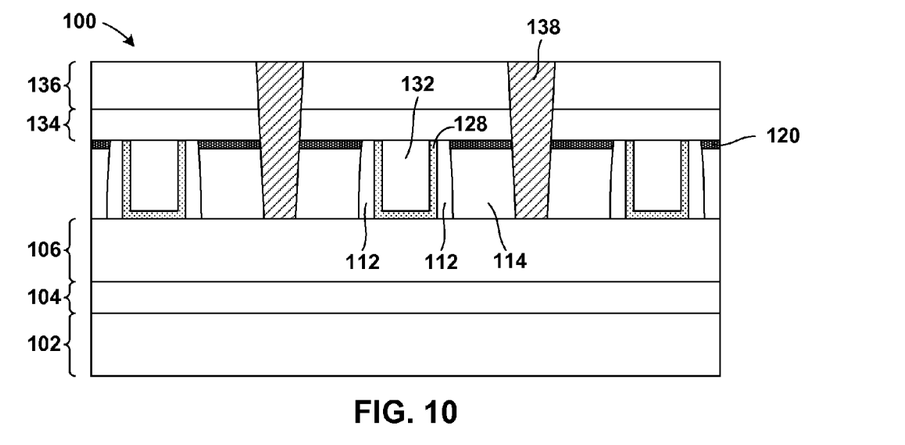
FIG. 10 depicts the structure of FIG. 9 with a relaxed pitch according to an exemplary embodiment.

The structure 100, as shown in FIG. 9, illustrates a semiconductor structure having a tight pitch, or minimum spacing between semiconductor devices. Because of the tight pitch configuration etching the contact hole removes substantially all of the first oxide layer 114 from between the pair of dielectric spacers 112. Therefore, in tight pitch designs the contact 138 may then be formed in direct contact with the pair of dielectric spacers 112. In one embodiment, the structure 100 may have a relaxed pitch configuration, as shown in FIG. 10, where there may be an increased amount of space between semiconductor devices. In such cases, etching the contact hole may remove only a portion of the first oxide layer 114 because of the increased spacing between the semiconductor devices. Therefore, in relaxed pitch designs the contact 138 may then be formed in direct contact with the first oxide layer 114 and have none or minimal contact with the pair of dielectric spacers 112.

As mentioned above, some portion of the protective layer 120 may remain above the first oxide layer 114 after formation of the metal gate 132, and prior to final completion of the structure 100. In tight pitch configurations, as shown in FIG. 9, any remaining portion of the protective layer 120 may be substantially removed during etching of the contact hole. Therefore, in tight pitch designs the contact 138 may then be formed in direct contact with the pair of dielectric spacers 112. In relaxed pitch configurations, as shown in FIG. 10, some portion of the protective layer 120 may remain after etching the contact hole. Therefore, in relaxed pitch designs the contact 138 may then be formed in direct contact with the first oxide layer 114 and the protective layer 120. In addition, the protective layer 120 may be in direct contact with an upper portion of the pair of dielectric spacer 112, as shown in FIG. 10. The thickness of the protective layer 120 remaining after gate and contact formation may be about 5 nm or less.

Another method of forming a finFET using the robust RG process flow is described in detail below by referring to the accompanying drawings in FIGS. 11-16. The robust RG process flow eliminates the use of polysilicon as the dummy gate material and uses a material that can be easily removed without the risk of damaging surrounding structures. More specifically, an oxide dummy gate material may be used in place of the traditional polysilicon dummy gate material. Doing so may require an additional protective layer to prevent the removal of oxide based materials from between the finFET devices while the oxide dummy gate material is removed from between the device spacers. In this particular embodiment amorphous silicon may be used as the protective layer.

Figure 11:
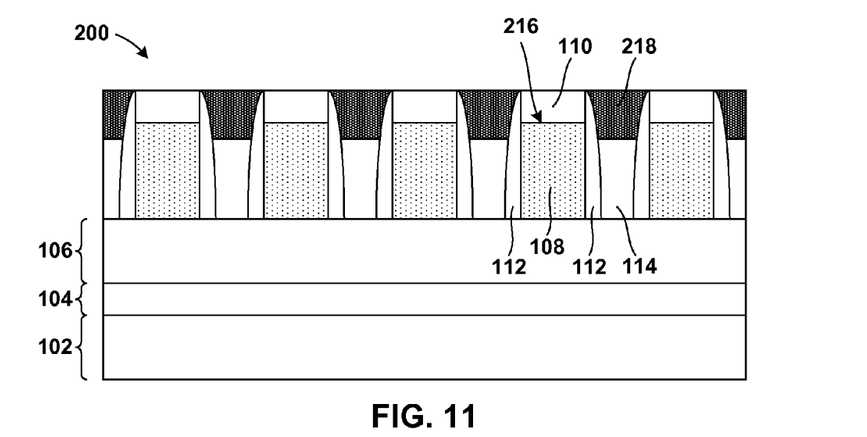
FIG. 11 depicts the deposition of a first oxide layer and a protective layer according to an exemplary embodiment.

Referring now to FIG. 11, a cross-sectional view of a structure 200 is shown at an intermediate step during the RG process flow. At this step of fabrication the first oxide layer 114 may be deposited on top of the structure 200 and then polished to expose the top of the hardmask 110 as described above. Also a previously described above the first oxide layer 114 may then be recessed using any suitable etching technique. The first oxide layer 114 may be recessed below the top surface 216 of the dummy gate 108 by a distance ranging from about 2 nm to about 10 nm. Preferably, the first oxide layer 114 may be recessed at least 5 nm below the top surface 216 of the dummy gate 108.

After recessing the first oxide layer 114, a protective layer 218 may be deposited on the structure 200. The protective layer 218 may include, but is not limited to, any suitable material resistant to etching techniques designed to remove oxide. The protective layer 218 may be deposited using typical deposition techniques, for example, atomic layer deposition (ALD), molecular layer deposition (MLD), chemical vapor deposition (CVD), physical vapor deposition (PVD), and spin on techniques. The protective layer 218 may include, for example, amorphous silicon. Preferably, the protective layer 218 may be deposited such that it may cover the hardmask 110, and then the protective layer 218 may be polished to be flush with the hardmask 110.

With continued reference to FIG. 11, a CMP technique may be used to polish the protective layer 218 selective to the hardmask 110. Any suitable CMP technique capable of polishing the protective layer 218 selective to the hardmask 110 may be used to recess the protective layer 218. In one embodiment, any suitable CMP technique capable of polishing silicon selective to nitride may be used. Portions of the protective layer 218 may remain above the first oxide layer 114 between the pair of dielectric spacers 112. The hardmask 110 may be exposed and the protective layer 218 may no longer remain on top of the hardmask 110. The CMP technique may result in a top surface of the hardmask 110 being substantially flush with a top surface of the protective layer 218.

Figure 12:
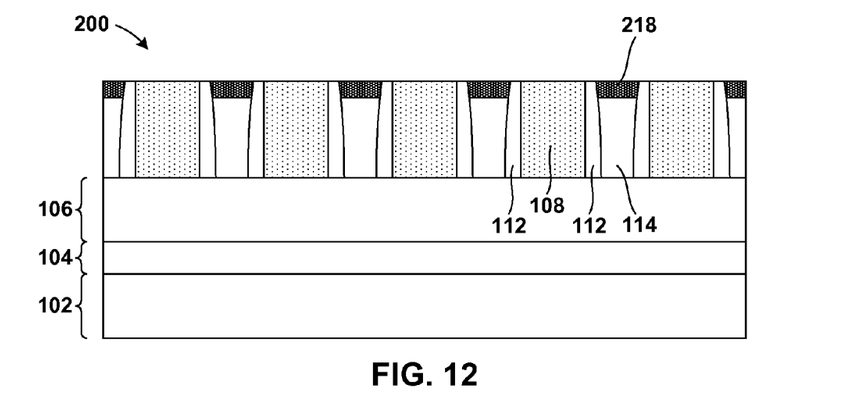
FIG. 12 depicts the removal of the hardmask according to an exemplary embodiment.

Referring now to FIG. 12, a CMP technique may be used to remove the hardmask 110 as described above. Removal of the hardmask 110 may expose the dummy gate 108 while some portions of the protective layer 218 may, preferably, remain above the first oxide layer 114 between the pair of dielectric spacers 112.

Figure 13:
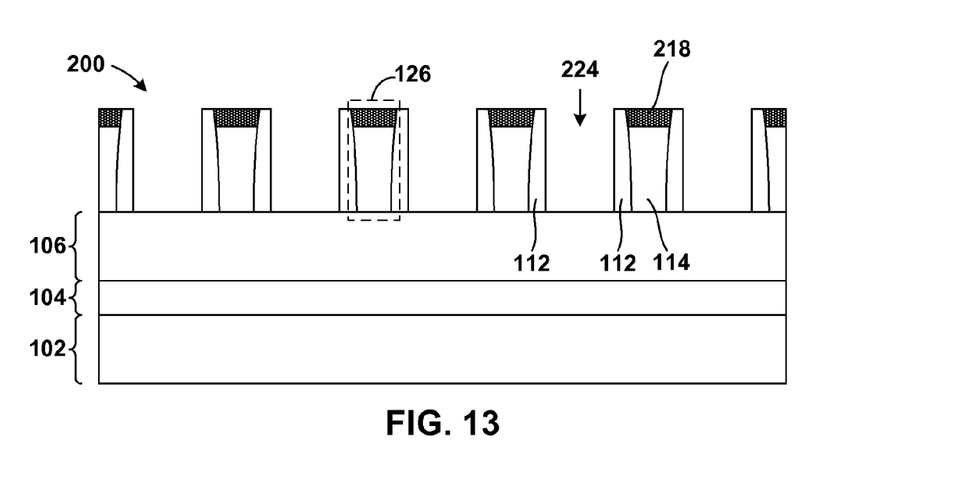
FIG. 13 depicts the removal of the dummy gate oxide according to an exemplary embodiment.

Referring now to FIG. 13, an etching technique may be used to remove the dummy gate 108 (shown in FIG. 12) as described above. The protective layer 218 may be resistant to the etching technique and therefore protect the first oxide layer 114 during etching. Removal of the dummy gate 108 may produce an opening 224 in which a gate may be subsequently formed. The first oxide layer 114 and the protective layer 218 together may be referred to as an inter-gate region 126.

Figure 14:
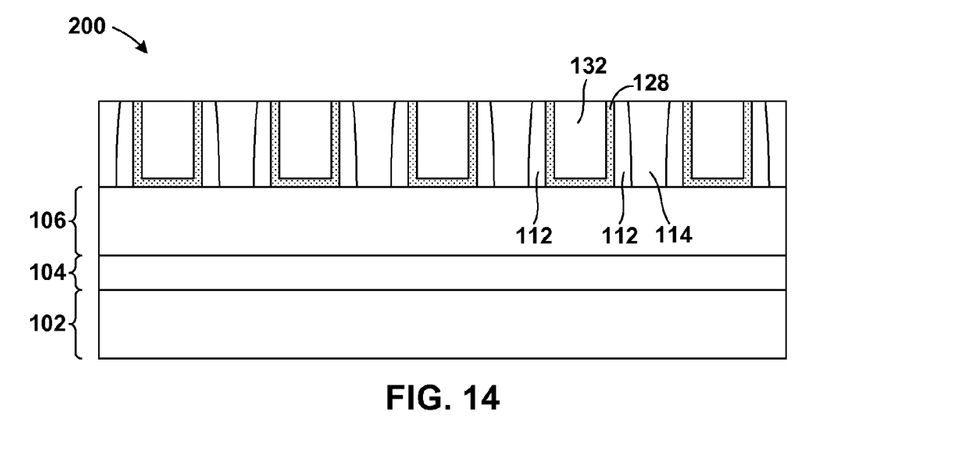
FIG. 14 depicts the deposition of a gate dielectric and a metal gate followed by a CMP technique according to an exemplary embodiment.

Now referring to FIG. 14, a gate may be formed in the opening 224 (shown in FIG. 13). The gate may include the gate dielectric 128 and the metal gate 132, as described above. The gate may also include a work function metal, as described above.

Figure 15:
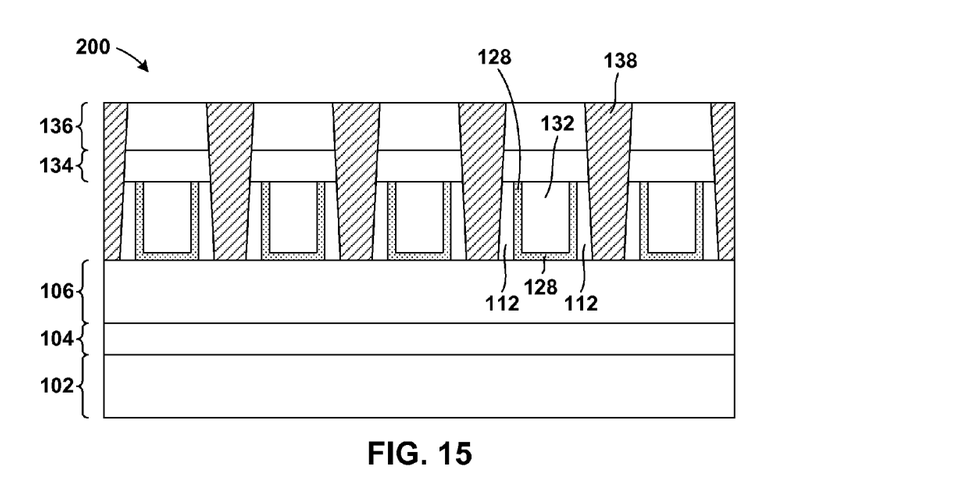
FIG. 15 depicts the formation of additional oxide layers and the subsequent formation of a contact according to an exemplary embodiment.

Referring now to FIG. 15, techniques known to a person having ordinary skill in the art may be used to complete fabrication of the structure 200. Completion of the structure 200 may include deposition of the dielectric capping layer 134, deposition of the inter-level dielectric layer 136, followed by the formation of the contact 138, as described above.

Figure 16:
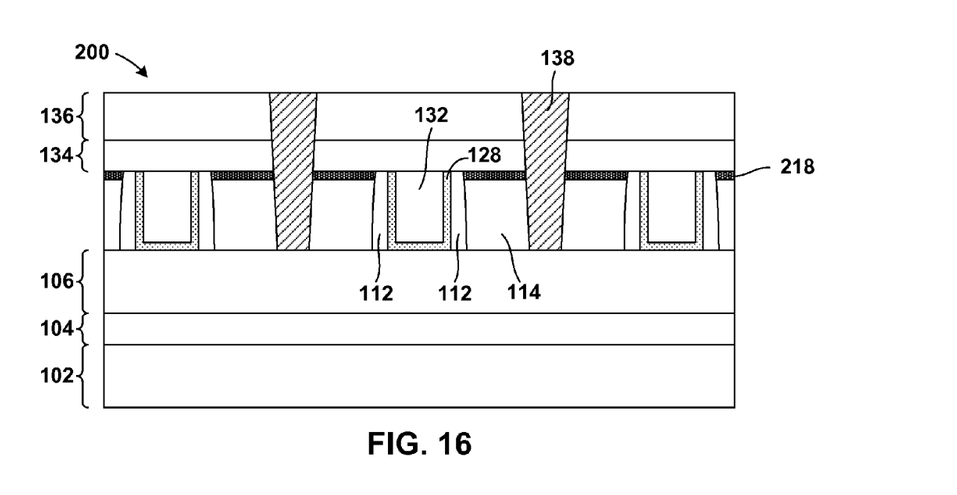
FIG. 16 depicts the structure of FIG. 15 with a relaxed pitch according to an exemplary embodiment.

The structure 200, as shown in FIG. 15, illustrates a semiconductor structure having a tight pitch, or minimum spacing between semiconductor devices. Because of the tight pitch configuration etching the contact hole removes substantially all of the first oxide layer 114 from between the pair of dielectric spacers 112. Therefore, in tight pitch designs the contact 138 may then be formed in direct contact with the pair of dielectric spacers 112. In one embodiment, the structure 200 may have a relaxed pitch configuration, as shown in FIG. 16, where there may be an increased amount of space between semiconductor devices. In such cases (not shown), etching the contact hole may remove only a portion of the first oxide layer 114 because of the increased spacing between the semiconductor devices. Therefore, in relaxed pitch designs the contact 138 may then be formed in direct contact with the first oxide layer 114 and have none or minimal contact with the pair of dielectric spacers 112.

As mentioned above, some portion of the protective layer 218 may remain after formation of the metal gate 132, and prior to final completion of the structure 200. In tight pitch configurations, as shown in FIG. 15, any remaining portion of the protective layer 218 may be substantially removed during etching of the contact hole. Therefore, in tight pitch designs the contact 138 may then be formed in direct contact with the pair of dielectric spacers 112. In relaxed pitch configurations, as shown in FIG. 16, some portion of the protective layer 218 may remain after etching the contact hole. Therefore, in relaxed pitch designs the contact 138 may then be formed in direct contact with the first oxide layer 114 and the protective layer 218. The thickness of the protective layer 218 remaining after gate and contact formation may be about 5 nm or less.

Another method of forming a finFET using the robust RG process flow is described in detail below by referring to the accompanying drawings in FIGS. 17-22. The robust RG process flow eliminates the use of polysilicon as the dummy gate material and uses a material that can be easily removed without the risk of damaging surrounding structures. More specifically, an oxide dummy gate material may be used in place of the traditional polysilicon dummy gate material. Doing so may require using a temporary gap fill material between the finFET devices during the formation and removal of the dummy gate. In this particular embodiment amorphous silicon may be temporarily used Referring now to FIG. 17, a cross-sectional view of a structure 300 is shown at an intermediate step during the RG process flow. At this step of fabrication a dielectric liner 318 may then be deposited on top of the structure 300. The dielectric liner 318 may be conformally deposited using typical deposition techniques, for example, atomic layer deposition (ALD), molecular layer deposition (MLD), chemical vapor deposition (CVD), physical vapor deposition (PVD), and spin on techniques. The dielectric liner 318 may include, for example, any suitable oxide. In one embodiment, the dielectric liner 318 may include silicon oxide, doped silicon oxide (for example carbon doped silicon oxide), or any combination thereof. The dielectric liner 318 may have a thickness ranging from about 3 nm to about 5 nm and ranges there between, although a thickness less than 3 nm and greater than 5 nm may be acceptable.

Figure 17:
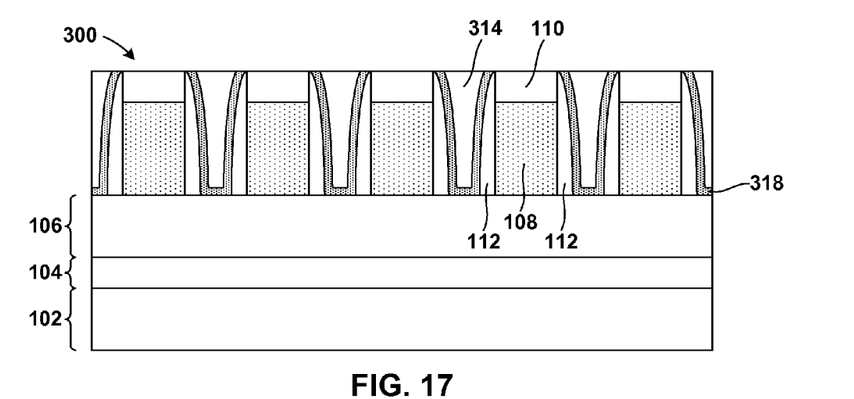
FIG. 17 depicts the deposition of a dielectric liner followed by a gap fill layer according to an exemplary embodiment.

A gap fill layer 314 may then be deposited on top of the dielectric liner 318. The gap fill layer 314 may be deposited using typical deposition techniques, for example, atomic layer deposition (ALD), molecular layer deposition (MLD), chemical vapor deposition (CVD), physical vapor deposition (PVD), and spin on techniques. The gap fill layer 314 may include, for example, amorphous silicon. Preferably, the gap fill layer 314 may be deposited such that it may cover the dielectric liner 318, and then the gap fill layer 314 and the dielectric liner 318 may be polished to be flush with the hardmask 110.

After depositing the gap fill layer 314 and the dielectric liner 318, a CMP technique may be used to polish the gap fill layer 314 and the dielectric liner 318 selective to the hardmask 110 as described above. Portions of the gap fill layer 314 and the dielectric liner 318 may remain between the pair of dielectric spacers 112. The hardmask 110 may be exposed and neither the gap fill layer 314 nor the dielectric liner 318 may remain on top of the hardmask 110. The CMP technique may result in a top surface of the hardmask 110 being substantially flush with a top surface of the gap fill layer 314.

Figure 18:
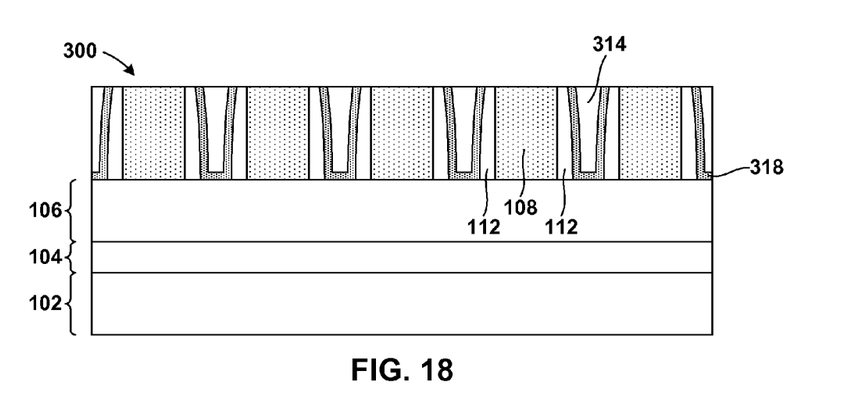
FIG. 18 depicts the removal of the hardmask according to an exemplary embodiment.

Referring now to FIG. 18, a CMP technique may be used to remove the hardmask 110 as described above. Removal of the hardmask 110 may expose the dummy gate 108 while some portions of the gap fill layer 314 and the dielectric liner 318 may remain between the pair of dielectric spacers 112.

Figure 19:
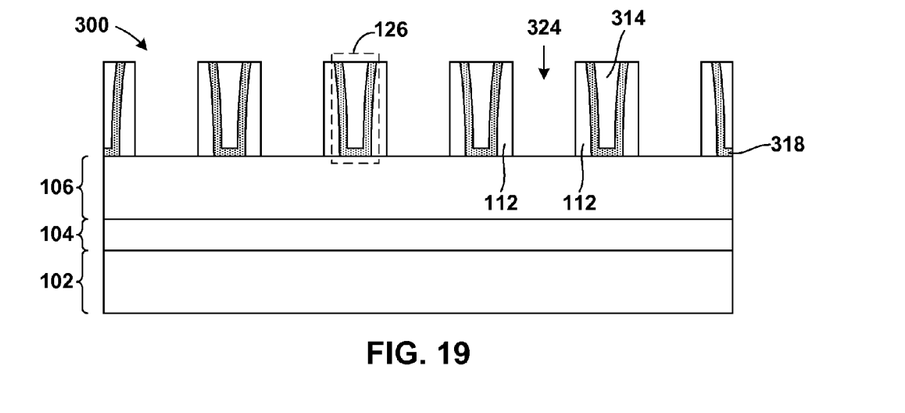
FIG. 19 depicts the removal of the dummy gate oxide according to an exemplary embodiment.

Referring now to FIG. 19, an etching technique may be used to remove the dummy gate 108 (shown in FIG. 18) as described above. The gap fill layer 314 and the dielectric liner 318 may be resistant to the etching technique and therefore may remain between the pair of dielectric spacers 112. Removal of the dummy gate 108 may produce an opening 324 in which a gate may be subsequently formed. The gap fill layer 314 and the dielectric liner 318 together may be referred to as an inter-gate region 126.

Figure 20:
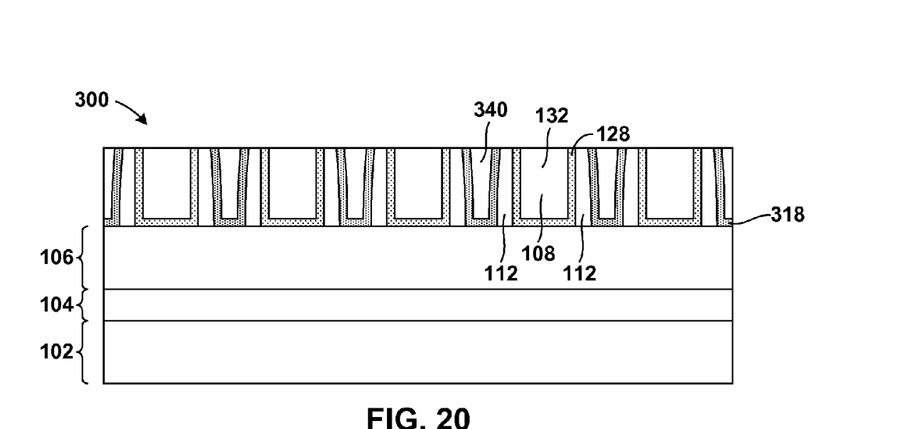
FIG. 20 depicts the deposition of a gate dielectric and a metal gate followed by a CMP technique according to an exemplary embodiment.

Now referring to FIG. 20, a gate may be formed in the opening 324 (shown in FIG. 19). The gate may include the gate dielectric 128 and the metal gate 132, as described above. The gate may also include a work function metal, as described above.

After formation of the metal gate 132, the gap fill layer 314 may be removed and replaced with a replacement layer 340. Any suitable etching technique capable of removing the gap fill layer 314 selective to the dielectric liner 318 may be used. In one embodiment, a dry or wet etching technique suitable for removing silicon may be used to remove the gap fill layer 314. In one embodiment, a wet etching technique using ammonium hydroxide or potassium hydroxide chemistries may be used to remove the gap fill layer 314.

Optionally, the gap fill layer 314 may be replaced with the replacement layer 340, or the gap fill layer 314 may remain in place. When using the replacement layer 340, it may be deposited using typical deposition techniques, for example, atomic layer deposition (ALD), molecular layer deposition (MLD), chemical vapor deposition (CVD), physical vapor deposition (PVD), and spin on techniques. The replacement layer 340 may include, for example, any suitable oxide. In one embodiment, the replacement layer 340 may include silicon oxide, doped silicon oxide (for example carbon doped silicon oxide), or any combination thereof. After deposition, a CMP technique may be used to polish the replacement layer 340 such that a top surface of the replacement layer 340 may be substantially flush with a top surface of the gate dielectric 128 and the metal gate 132.

Figure 21:
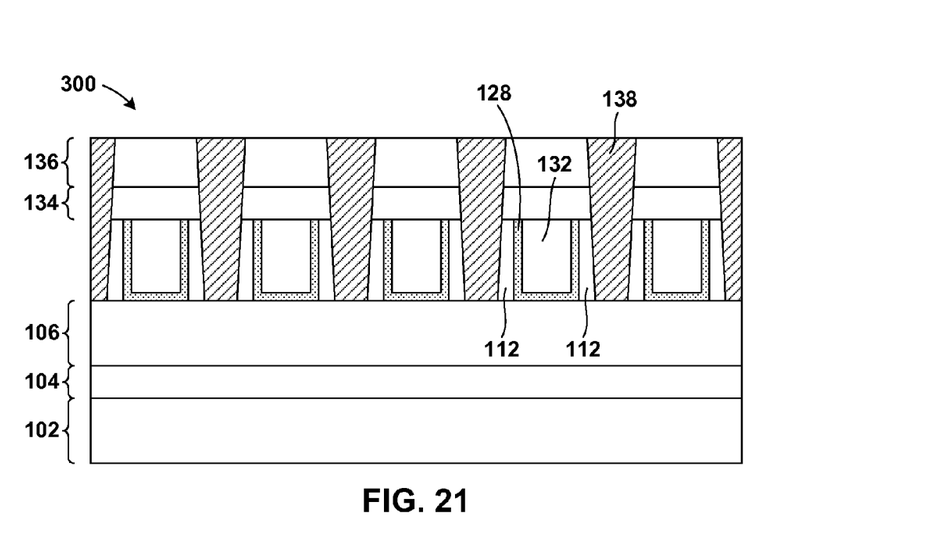
FIG. 21 depicts the formation of additional oxide layers and the subsequent formation of a contact according to an exemplary embodiment.

Referring now to FIG. 21, techniques known to a person having ordinary skill in the art may be used to complete fabrication of the structure 300. Completion of the structure 300 may include deposition of the dielectric capping layer 134, deposition of the inter-level dielectric layer 136, followed by the formation of the contact 138, as described above.

Figure 22:
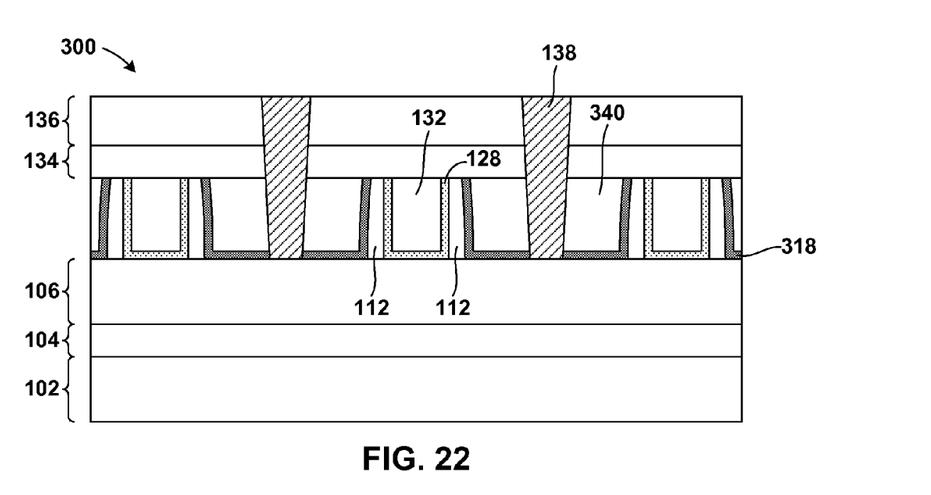
FIG. 22 depicts the structure of FIG. 21 with a relaxed pitch according to an exemplary embodiment.

The structure 300, as shown in FIG. 21, illustrates a semiconductor structure having a tight pitch, or minimum spacing between semiconductor devices. Because of the tight pitch configuration etching the contact hole removes substantially all of the replacement layer 340 and the dielectric liner 318 from between the pair of dielectric spacers 112. Therefore, in tight pitch designs the contact 138 may then be formed in direct contact with the pair of dielectric spacers 112. In one embodiment, the structure 300 may have a relaxed pitch configuration, as shown in FIG. 22, where there may be an increased amount of space between semiconductor devices. In such cases, etching the contact hole may remove only a portion of the replacement layer 340 and the dielectric liner 318 because of the increased spacing between the semiconductor devices. Therefore, in relaxed pitch designs the contact 138 may then be formed in direct contact with the gap fill layer 314 or replacement layer 340 (depending upon the embodiment) and the dielectric liner 318, and have none or minimal contact with the pair of dielectric spacers 112. The liner 318 may be in direct contact with the pair of dielectric spacers 112 and the fin 106, as shown in FIG. 22. However, the gap fill layer 314 or replacement layer 340 may not be in contact with either the pair of dielectric spacers 112 or the fin 106.

The embodiments described above detail various ways to remove a dummy gate in a RG process flow without damaging surrounding structures and without the need for additional processing techniques to prevent such damage. Generally, this may be accomplished by forming the dummy gate from a material other than silicon, for example, an oxide as described in detail above. It he various embodiments described in detail above, the oxide dummy gate may be removed without causing damage to the surrounding structures and without the need for additional processing techniques to prevent such damage.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a dummy gate on a substrate, wherein the dummy gate is made from an oxide;
    forming a pair of dielectric spacers on opposite sides of the dummy gate;
    forming an inter-gate region above the substrate and, the inter-gate region comprising a protective layer on top of a first oxide layer, the protective layer and the first oxide layer each being in direct contact with at least one of the pair of dielectric spacers;
    removing the dummy gate selective to the protective layer to leave an opening; and
    forming a gate within the opening.

2. The method of claim 1, further comprising:
    forming a dielectric capping layer above the gate and the inter-gate region;
    forming an inter-level dielectric layer above the dielectric capping layer; and
    forming a contact extending from a top surface of the inter-level dielectric layer to the substrate, and extending through the inter-level dielectric layer, the dielectric capping layer, and the inter-gate region.

3. The method of claim 1, wherein the protective layer comprises SiBCN.

4. The method of claim 1, wherein the protective layer comprises amorphous silicon.

5. The method of claim 1, wherein the gate comprises a gate dielectric, a work function metal, and a metal gate.

6. A method comprising:
    forming a dummy gate on a substrate, wherein the dummy gate is made from an oxide;
    forming a pair of dielectric spacers on opposite sides of the dummy gate;
    forming an inter-gate region above the substrate and adjacent to the dummy gate, the inter-gate region comprising a gap fill layer on top of a dielectric liner, wherein the dielectric liner is an oxide and in direct contact with the at least one of the pair of dielectric spacers and the substrate, and wherein the gap fill layer does not contact either the at least one of the pair of dielectric spacers or the substrate;
    removing the dummy gate to leave an opening; and
    forming a gate within the opening.

7. The method of claim 6, further comprising:
    forming a dielectric capping layer above the gate and the inter-gate region;
    forming an inter-level dielectric layer above the dielectric capping layer; and
    forming a contact extending from a top surface of the inter-level dielectric layer to the substrate, and extending through the inter-level dielectric layer, the dielectric capping layer, and the inter-gate region.

8. The method of claim 6, wherein removing the dummy gate to leave an opening comprises removing the dummy gate selective to the gap fill layer.

9. The method of claim 6, wherein the gap fill layer comprises amorphous silicon.

10. The method of claim 6, further comprising:
    replacing all of the gap fill layer with an oxide replacement layer.

11. The method of claim 6, wherein the gate comprises a gate dielectric, a work function metal, and a metal gate.

* * * * *